(12) United States Patent
Lee et al.

(10) Patent No.: US 12,132,154 B2
(45) Date of Patent: Oct. 29, 2024

(54) SEMICONDUCTOR LIGHT EMITTING DEVICE

(71) Applicant: SAMSUNG ELECTRONICS CO., LTD., Suwon-si (KR)

(72) Inventors: Dongkuk Lee, Hwaseong-si (KR); Daesup Kim, Suwon-si (KR); Dongmyung Shin, Seoul (KR); Wooseok Jang, Hwaseong-si (KR); Sunhwan Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 527 days.

(21) Appl. No.: 17/483,118

(22) Filed: Sep. 23, 2021

(65) Prior Publication Data

US 2022/0246805 A1 Aug. 4, 2022

(30) Foreign Application Priority Data

Feb. 4, 2021 (KR) .................. 10-2021-0016288

(51) Int. Cl.
*H01L 33/50* (2010.01)
*H01L 33/00* (2010.01)
*H01L 33/60* (2010.01)
*H01L 33/62* (2010.01)

(52) U.S. Cl.
CPC ........ *H01L 33/504* (2013.01); *H01L 33/0095* (2013.01); *H01L 33/60* (2013.01); *H01L 33/62* (2013.01); *H01L 2933/0041* (2013.01)

(58) Field of Classification Search
None
See application file for complete search history.

(56) References Cited

U.S. PATENT DOCUMENTS

| 6,372,608 | B1 | 4/2002 | Shimoda et al. |
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |

(Continued)

FOREIGN PATENT DOCUMENTS

| KR | 1020170027088 A | 3/2017 |
| KR | 101912105 B1 | 1/2019 |

(Continued)

*Primary Examiner* — Robert K Carpenter
(74) *Attorney, Agent, or Firm* — Sughrue Mion, PLLC (57) ABSTRACT

A semiconductor light emitting device is provided. The device includes: an LED chip having a lower surface, an upper surface, and a side surface between the upper surface and the lower surface; first and second conductive bumps disposed on first and second conductive bumps provided on the lower surface; a first wavelength conversion layer having a first region provided on the upper surface of the LED chip and a second region which extends past the side surface of the LED chip; a second wavelength conversion layer having a first surface contacting the side surface of the LED chip, a second surface, a third surface connecting the first surface and the second surface, and contacting the second region, and a fourth surface located opposite to the third surface and inclined; and a reflective resin portion provided on the lower surface of the LED chip and the fourth surface.

20 Claims, 8 Drawing Sheets

(56) References Cited

U.S. PATENT DOCUMENTS

| | | |
|---|---|---|
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,368,690 B2 | 6/2016 | Itc |
| 10,008,642 B2 | 6/2018 | Seo et al. |
| 10,043,952 B2 | 8/2018 | Vampola et al. |
| 10,121,945 B2 | 11/2018 | Kim et al. |
| 10,230,027 B2 | 3/2019 | Chen |
| 10,522,728 B2 | 12/2019 | Chen et al. |
| 10,680,145 B2 | 6/2020 | Pan et al. |
| 10,777,713 B2 | 9/2020 | Tangring |
| 2014/0322844 A1* | 10/2014 | Ichikawa ............ H01L 33/0093 438/29 |
| 2015/0263243 A1 | 9/2015 | Nakagawa et al. |
| 2017/0005245 A1* | 1/2017 | Hsu ....................... H01L 33/507 |
| 2017/0229621 A1 | 8/2017 | Chen et al. |
| 2018/0033934 A1* | 2/2018 | Matsuda ............... H01L 33/486 |
| 2018/0212128 A1 | 7/2018 | Hayashi |
| 2020/0013932 A1 | 1/2020 | Moon et al. |
| 2020/0144463 A1 | 5/2020 | Sobczyk |
| 2020/0144467 A1* | 5/2020 | Lan ........................ H01L 33/62 |

FOREIGN PATENT DOCUMENTS

| | | |
|---|---|---|
| KR | 1020190109789 A | 9/2019 |
| KR | 1020190110356 A | 9/2019 |

\* cited by examiner

SEMICONDUCTOR LIGHT EMITTING DEVICE

CROSS-REFERENCE TO RELATED APPLICATION(S)

This application claims priority from Korean Patent Application No. 10-2021-0016288 filed on Feb. 4, 2021 in the Korean Intellectual Property Office, the disclosure of which is incorporated herein by reference in its entirety.

BACKGROUND

Methods, apparatuses and systems consistent with example embodiments relate to a semiconductor light emitting device.

A light-emitting diode (LED) may recombine electrons and holes in a bonded semiconductor to generate energy, convert the generated energy into light, and emit the converted light. Such a light-emitting diode is widely used as a light source of a lighting device and a light source of a backlight device for a large-sized liquid crystal display (LCD), and the development thereof is accelerating.

In general, a light emitting diode may be provided as a semiconductor light emitting device packaged in various forms so as to be easily mounted on an application device. There is a need for a package structure in which deterioration of light efficiency due to light loss or total reflection is prevented, and color uniformity of emitted light is improved.

SUMMARY

One or more example embodiments provide a semiconductor light emitting device minimizing light loss to improve light efficiency and improving color uniformity of a light emitting surface.

According to an aspect of an example embodiment, a semiconductor light emitting device includes an LED chip having a lower surface on which a first electrode and a second electrode are arranged, an upper surface opposite to the lower surface, and a side surface between the upper surface and the lower surface; a first conductive bump disposed on the first electrode and a second conductive bump disposed on the second electrode; a first wavelength conversion layer having a first region provided on the upper surface of the LED chip and a second region which extends past the side surface of the LED chip; a second wavelength conversion layer having a first surface contacting the side surface of the LED chip, a second surface opposite to the first surface, a third surface connecting the first surface and the second surface, and contacting the second region, and a fourth surface located opposite to the third surface and inclined; and a reflective resin portion provided on the lower surface of the LED chip and the fourth surface, and defining openings that expose at least a portion of each of the first conductive bump and the second conductive bump.

According to an aspect of an example embodiment, a semiconductor light emitting device includes: an LED chip having a lower surface on which a first electrode and a second electrode are arranged, an upper surface opposite to the lower surface, and a side surface between the upper surface and the lower surface; a first wavelength conversion layer provided on the upper surface of the LED chip and comprising an extended region which extends past the side surface of the LED chip; a second wavelength conversion layer contacting the side surface of the LED chip and the extended region, wherein a cross-sectional area of the second wavelength conversion layer decreases as distance from the side surface of the LED chip increases; and a reflective resin portion provided on the lower surface of the LED chip, extending to the side surface of the LED chip, and having an interface contacting the second wavelength conversion layer.

According to an aspect of an example embodiment, a semiconductor light emitting device includes: an LED chip having a lower surface on which a first electrode and a second electrode are arranged, an upper surface opposite to the lower surface, and a side surface between the upper surface and the lower surface; a first conductive bump disposed on the first electrode and a second conductive bump disposed on the second electrode; a first wavelength conversion layer provided on the upper surface of the LED chip and having an extended region which extends past the side surface of the LED chip; a second wavelength conversion layer disposed to surround the side surface of the LED chip and contact the first wavelength conversion layer, wherein the second wavelength conversion layer has an inclined surface with respect to the side surface of the LED chip and faces an exterior of the LED chip; and a reflective resin portion provided on the lower surface of the LED chip, the lower surface of the LED chip and the inclined surface of the second wavelength conversion layer, and defining openings that expose at least a portion of each of the first conductive bump and the second conductive bump. A side surface of the second wavelength conversion layer and a side surface of the reflective resin portion are coplanar.

According to an aspect of an example embodiment, a method of manufacturing a plurality of light emitting devices includes: providing a first wavelength conversion film on a base film; providing a plurality of light-emitting diode (LED) chips on the first wavelength conversion film; providing a second wavelength conversion film having a curved surface on the first wavelength conversion film between the plurality of LED chips; providing a reflective resin on the plurality of LED chips and the second wavelength conversion film; and separating the first wavelength conversion film, the plurality of LED chips, the second wavelength conversion film and the reflective resin into the plurality of light emitting devices

BRIEF DESCRIPTION OF DRAWINGS

The above and other aspects, features, and advantages will be more clearly understood from the following description, taken in conjunction with the accompanying drawings, in which.

DETAILED DESCRIPTION

Hereinafter, example embodiments will be described in detail with reference to the accompanying drawings.

Figure 1:
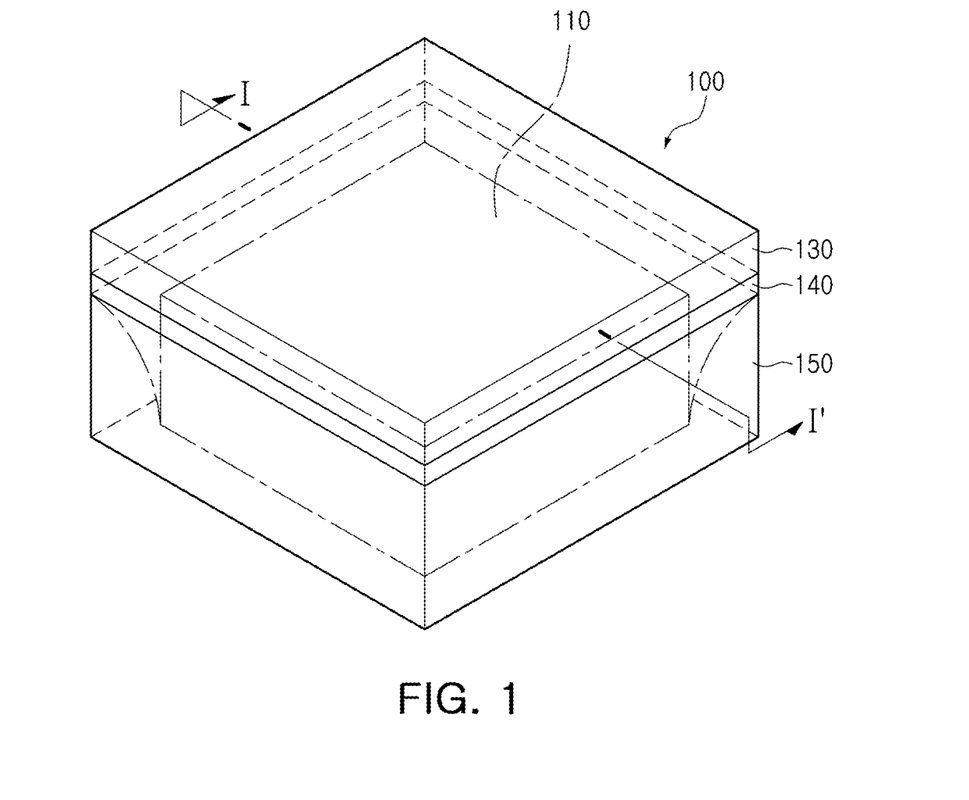
FIG. 1 is a perspective view of a semiconductor light emitting device according to an example embodiment.
Figure 2:
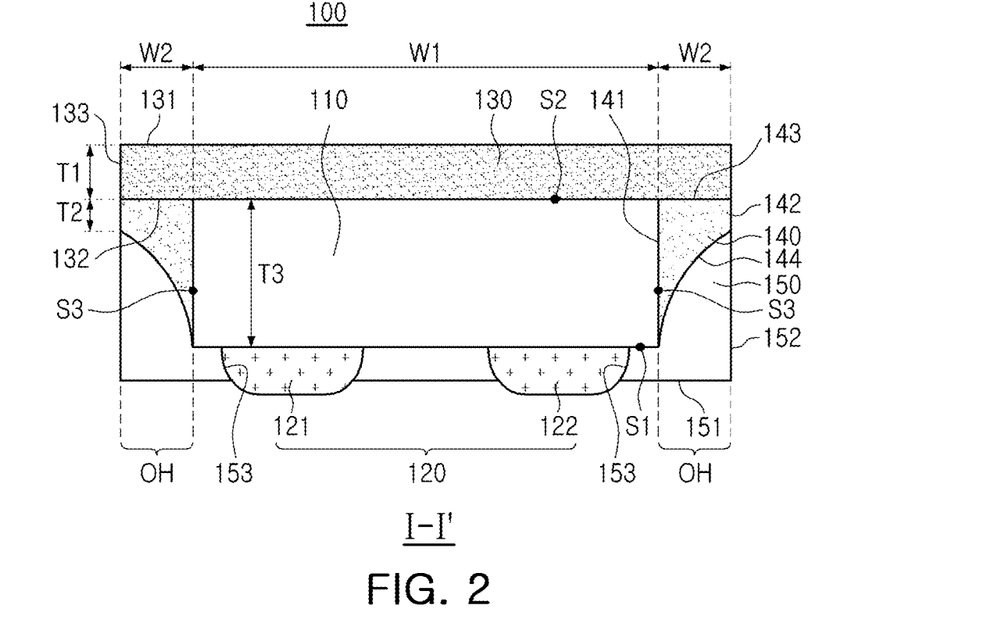
FIG. 2 is a side cross-sectional view of the semiconductor light emitting device of FIG. 1, taken along line I-I'.

FIG. 1 is a perspective view of a semiconductor light emitting device according to an example embodiment, and FIG. 2 is a side cross-sectional view of FIG. 1, taken along line I-I'.

Referring to FIGS. 1 and 2, a semiconductor light emitting device 100 according to an example embodiment may include an LED chip 110, a first wavelength conversion layer 130 disposed on an upper surface S2 of the LED chip 110, a second wavelength conversion layer 140 disposed on a side surface S3 of the LED chip 110, and a reflective resin portion 150 covering a lower surface S1 of the LED chip 110 and contacting the second wavelength conversion layer 140.

Referring to FIG. 1, the LED chip 110 may have a hexahedral shape. Referring to FIG. 2, the LED chip 110 may have an upper surface S2 and a lower surface S1, located opposite to each other, and side surfaces S3 located between the upper surface S2 and the lower surface S1. The LED chip 110 may emit blue light. For example, the LED chip 110 may emit light having a dominant wavelength ranging from approximately 440 nm to approximately 460 nm. Conductive bumps 120 may be disposed on the lower surface S1 of the LED chip 110. The conductive bumps 120 may include first and second conductive bumps 121 and 122.

As illustrated in FIG. 2, the first wavelength conversion layer 130 may be disposed to entirely cover the upper surface S2 of the LED chip 110. For example, the first wavelength conversion layer 130 may cover the upper surface S2 of the LED chip 110, and may light emitted from the LED chip 110 may be emitted through an upper surface of the semiconductor light emitting device 100.

In addition, the first wavelength conversion layer 130 may have an extended region OH covering an upper surface 144 of the second wavelength conversion layer 140. For example, the first wavelength conversion layer 130 may have an extended region OH extending beyond the side surfaces S3 of the LED chip 110. An upper surface 131 of the first wavelength conversion layer 130 may be formed as a flat surface, and a side surface 133 of the first wavelength conversion layer 130 may be coplanar with a side surface 142 of the second wavelength conversion layer 140. The first wavelength conversion layer 130 may be disposed to have a substantially uniform thickness T1 on the upper surface S2 of the LED chip 110. In this case, the substantially uniform thickness refers to a degree to which a change in thickness is within an error range (i.e., a tolerance) in a manufacturing process, even though a thickness is not completely constant along the upper surface S2 of the LED chip 110.

Figure 3:
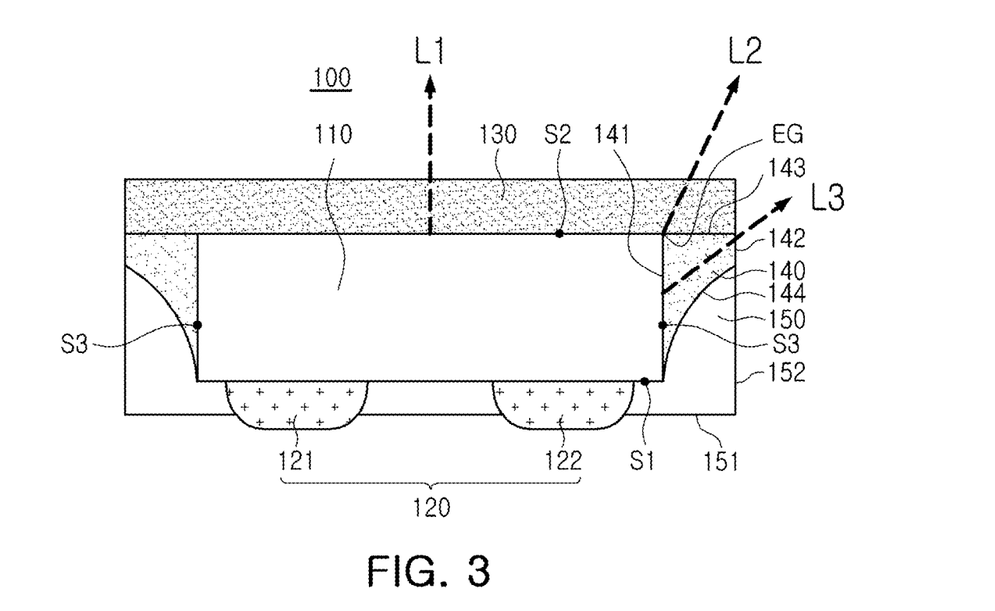
FIG. 3 is a view illustrating an optical path of the semiconductor light emitting device of FIG. 2.

Referring to FIG. 3, the first wavelength conversion layer 130 may include at least one wavelength conversion material to convert a portion of light emitted from the LED chip 110 into light having a wavelength that is different from a wavelength of the emitted light.

The first wavelength conversion layer 130 may be formed in a state in which a wavelength conversion material is dispersed in a light-transmitting material. The light-transmitting material may include a thermosetting resin. In an example embodiment, an epoxy resin or a silicone resin may be used as the thermosetting resin used for the first wavelength conversion layer 130. Because the first wavelength conversion layer 130 includes a thermosetting resin, when heated to a temperature that is below a certain temperature, the first wavelength conversion layer 130 may have a semi-cured state, and may have a semi-curing property changing a phase thereof to a fluid level, and may be cured when further heated to a temperature that is above the certain temperature. Therefore, when the first wavelength conversion layer 130 is provided in a semi-cured sheet state with an adhesive property to attach the first wavelength conversion layer 130 to the LED chip 110, and a heating process is performed therein, the first wavelength conversion layer 130 may be cured and may be firmly attached to the LED chip 110. The light-transmitting material constituting the first wavelength conversion layer 130 may have a refractive index that is lower than a refractive index of a material constituting the second wavelength conversion layer 140. In addition, the light-transmitting material constituting the first wavelength conversion layer 130 may have a refractive index that is greater than a refractive index of a material constituting the reflective resin portion 150. As the wavelength conversion material, such as a phosphor, a quantum dot, or the like, may be used. For example, the phosphor may be a garnet-based phosphor (e.g., YAG, TAG, and LuAG), a silicate-based phosphor, a nitride-based phosphor, a sulfide-based phosphor, an oxide-based phosphor, or the like, and the phosphor may be formed as a single component, or as a mixture with a plurality of components in a predetermined ratio.

The second wavelength conversion layer 140 may be disposed to cover the side surfaces S3 of the LED chip 110. As viewed from above, the second wavelength conversion layer 140 may surround the side surfaces S3 of the LED chip 110 with a substantially uniform width W2, respectively. The width W2 of the second wavelength conversion layer 140 may be equal to a width of the extended region OH of the first wavelength conversion layer 130. For example, the width W2 of the second wavelength conversion layer 140 may be 5% to 37.5% of a width W1 of the LED chip 110. When the second wavelength conversion layer 140 is disposed to entirely surround the side surfaces S3 of the LED chip 110, the second wavelength conversion layer 140 may be disposed to have a substantially uniform width. However, example embodiments are not limited thereto, and the second wavelength conversion layers 140 that are disposed on the side surfaces S3 of the LED chip 110 opposite to each other may have substantially uniform thicknesses.

Referring to FIG. 3, the second wavelength conversion layer 140 may include at least one wavelength conversion material which may convert a portion of light emitted from the LED chip 110 into light L3 having a wavelength different from a wavelength of the emitted light. Therefore, the second wavelength conversion layer 140 may be disposed to surround each of the side surfaces of the LED chip 110, and light emitted from the LED chip 110 may be emitted through the side surface of the semiconductor light emitting device 100.

The second wavelength conversion layer 140 may include a first surface 141 contacting the side surfaces S3 of the LED chip 110, a second surface 142 opposite to the first surface 141, a third surface 143 connecting the first surface 141 and the second surface 142 and contacting the first wavelength conversion layer 130, and a fourth surface 144 that is inclined and located opposite to the third surface 143.

The first surface 141 may be a surface contacting the side surface S3 of the LED chip 110, and the light L3 emitted from the LED chip 110 may enter the second wavelength conversion layer 140 through the first surface 141. The first surface 141 may have a thickness T3, substantially equal to a thickness of each of the side surfaces S3 of the LED chip 110. When an insulating portion surrounding the lower surface S1 of the LED chip 110 is disposed, the first surface 141 may extend to cover only a portion of the insulating portion.

The second surface 142 may form the side surface of the semiconductor light emitting device 100, and may convert a wavelength of the light L3 emitted from the LED chip 110 and emit the light L3 through the side surface of the semiconductor light emitting device 100. A thickness T2 of the second surface 142 may be 5 to 80% of the thickness T3 of the first surface. The thickness T2 of the second surface 142 may be adjusted to change directivity angles and amounts of light emitted through the side surface of the semiconductor light emitting device 100.

The third surface 143 may be a surface contacting the first wavelength conversion layer 130, and light emitted from the LED chip 110 through the third surface 143 may be incident on the first wavelength conversion layer 130.

The fourth surface 144 may be an interface contacting the reflective resin portion 150, and may be formed as an inclined surface. The fourth surface 144 may be used as a reflective surface that reflects light emitted from the LED chip 110. The fourth surface 144 may be formed as a flat surface or a curved surface. When the fourth surface 144 is a curved surface, the curved surface may be concave or convex toward the third surface 143. A radius of curvature of the curved surface may be 0.7 mm to 1.4 mm. When the fourth surface 144 is formed as a convex curved surface toward the third surface 143, the fourth surface 144 may have a meniscus-shaped curved surface. A case in which the fourth surface 144 is formed as a convex curved surface toward the third surface 143 will be described as an example.

The second wavelength conversion layer 140 may be formed in a state in which a wavelength conversion material is dispersed in a light-transmitting material. The second wavelength conversion layer 140 may be formed using a wavelength conversion material is dispersed in a light-transmitting material, similar to the light-transmitting material used in the first wavelength conversion layer 130, described above. The light-transmitting material may include the thermosetting resin described above. Therefore, when heated to a temperature that is below a certain temperature, the second wavelength conversion layer 140 may have a semi-cured state, and may have a semi-curing property changing a phase thereof to a fluid level, and may be cured when further heated to a temperature that is above the certain temperature. Therefore, the wavelength conversion material may be dispersed in a light-transmitting material that is applied to the side surface S3 of the LED chip 110 in a semi-cured state, and the light-transmitting material may be then cured by a heating process. Therefore, the light-transmitting material with the wavelength conversion material dispersed therein may cover the side surface S3 of the LED chip 110.

The light-transmitting material constituting the second wavelength conversion layer 140 may have a refractive index that is greater than a refractive index of a material constituting the first wavelength conversion layer 130. In addition, the light-transmitting material constituting the second wavelength conversion layer 140 may have a refractive index that is greater than a refractive index of a material constituting the reflective resin portion 150. In addition, the light-transmitting material constituting the second wavelength conversion layer 140 may have a refractive index that is lower than a refractive index of a substrate included in the LED chip 110. Due to such a refractive index arrangement, total reflection in the semiconductor light emitting device 100 may be minimized to improve light extraction efficiency.

The second wavelength conversion layer 140 may use a wavelength conversion material that is identical to or different from a wavelength conversion material included in the first wavelength conversion layer 130. The wavelength conversion material of the first wavelength conversion layer 130 and the wavelength conversion material of the second wavelength conversion layer 140 may both decrease (i.e., warm) a color temperature of light generated by the LED chip 110. When a wavelength conversion material that is identical to a wavelength conversion material of the first wavelength conversion layer 130 is used for the second wavelength conversion layer 140, a content (i.e., concentration) of the wavelength conversion material included in the second wavelength conversion layer 140 may be smaller than a content (i.e., concentration) of the wavelength conversion material included in the first wavelength conversion layer 130. Therefore, because the light L3 emitted through the second wavelength conversion layer 140 may have a higher color temperature compared to the light L1 and L2 emitted through the first wavelength conversion layer 130. Thus, light emitted from the second wavelength conversion layer 140 may be closer to cool white, compared to light emitted from the first wavelength conversion layer 130. For example, a correlated color temperature (CCT) value of the light L1 and L2 emitted from the first wavelength conversion layer 130 may be lower than a correlated color temperature value of the light L3 emitted from the second wavelength conversion layer 140.

The second wavelength conversion layer 140 may increase a directivity angle of light emitted through the side surface of the LED chip 110, and may improve color uniformity of light emitted from the LED chip 110.

Referring to FIG. 3, the light L3 emitted from the side surfaces S3 of the LED chip 110 may pass through the second surface 142 of the second wavelength conversion layer 140. In this regard, the light L3 may thus have a directivity angle that is larger than the directivity angle would be in a case in which a wavelength conversion layer is not disposed on the side surface S3 of the LED chip 110. For example, a semiconductor light emitting device 100 according to an example embodiment may provide light having a directivity angle of about 140° or more. In an example embodiment, it was confirmed that a color over angle (CoA) of light emitted from a semiconductor light emitting device was improved to about 0.015 level based on ΔU'V'.

In addition, the light L3 emitted from the second wavelength conversion layer 140 may be cooler than light L1 and L2, having a correlated color temperature value that is higher than a correlated color temperature value of the light L1 and L2 emitted from the first wavelength conversion layer 130. As discussed below, light emitted in an edge area of a may have a lower color temperature than light emitted from a central area of a semiconductor light emitting device. As the light L3 has a higher color temperature than light L1 and L2, a color temperature of light emitted from the side surface of the semiconductor light emitting device 100 may be relatively increased, and a color temperature of the light emitted from the side surface of the semiconductor light emitting device 100 may be adjusted to be similar to a color temperature of light emitted from an upper surface of the semiconductor light emitting device 100. Therefore, color uniformity of light emitted from the semiconductor light emitting device 100 may be improved by minimizing a color temperature difference between the light emitted from the upper surface of the semiconductor light emitting device 100 and the light emitted from the side surface of the semiconductor light emitting device 100.

Figure 7A:
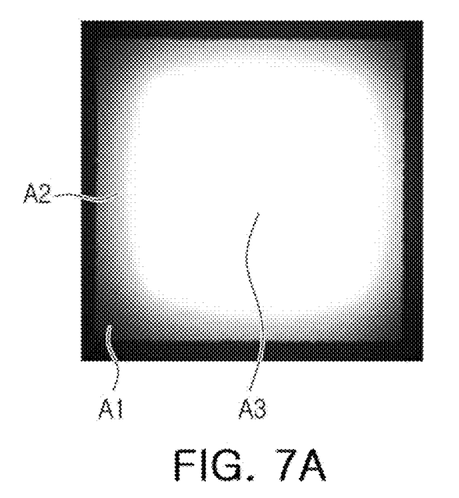
FIGS. 7A and 7B are photographs of semiconductor light emitting devices according to a comparative example and an example embodiment.
Figure 7B:
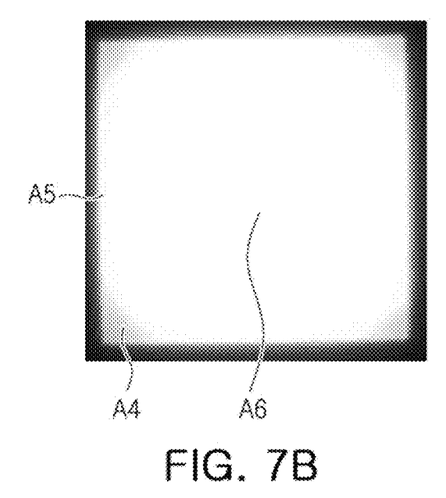

FIGS. 7A and 7B are photographs of semiconductor light emitting devices according to a comparative example and an example embodiment. In FIG. 7A, it can be seen that, in a comparative example, light having a lower color temperature is emitted in an edge area A2, as compared to in a central area A3. In addition, it can be seen that light having a lower color temperature is emitted in a corner region A1, as compared to in the edge region A2. In FIG. 7B, it can be seen that, in an example embodiment, light having color temperatures, substantially similar to each other, in a central area A6 and an edge area A5 may be emitted, and a color temperature difference of light emitted from a corner area A4 and the edge area A5 is smaller, compared to a comparative example. Therefore, it can be seen that color uniformity of emitted light is improved in the example embodiment, compared to the comparative example.

Figure 4A:
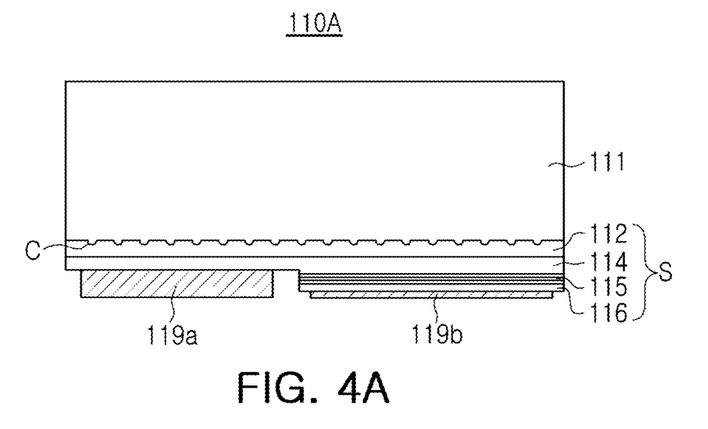
FIGS. 4A and 4B are side cross-sectional views illustrating a light emitting device that may be employed in the semiconductor light emitting device of FIG. 1.
Figure 4B:
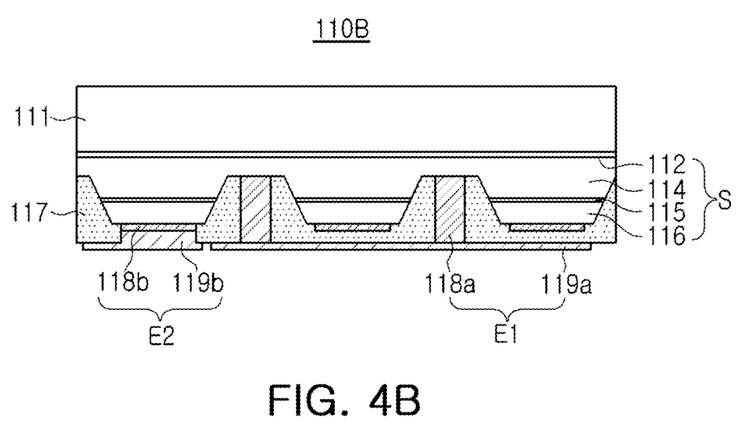

The LED chip 110 employed in example embodiments may have a flip chip structure in which a light emitting surface and an electrode forming surface are located opposite to each other. However, example embodiments are not limited thereto, and various types of LED chips may be employed. FIGS. 4A and 4B are side cross-sectional views illustrating a light emitting device that may be employed in a semiconductor light emitting device.

Referring to FIG. 4A, an LED chip 110A may include a substrate 111, and a light emitting structure S having a first conductivity-type semiconductor layer 114, an active layer 115, and a second conductivity-type semiconductor layer 116, sequentially arranged on the substrate 111. A buffer layer 112 may be disposed between the substrate 111 and the first conductivity-type semiconductor layer 114.

The substrate 111 may be an insulating substrate such as sapphire. However, example embodiments are not limited thereto, and the substrate 111 may be a conductive substrate or a semiconductor substrate, in addition to the insulating substrate. For example, the substrate 111 may be SiC, Si, $MgAl_2O_4$, MgO, $LiAlO_2$, $LiGaO_2$, or GaN, in addition to sapphire. An unevenness C may be formed on an upper surface of the substrate 111. The unevenness (C) may improve quality of a single crystal to be grown while improving light extraction efficiency.

The buffer layer 112 may be $In_xAl_yGa_{1-x-y}N$ (where, $0 \le x \le 1$, and $0 \le y \le 1$). For example, the buffer layer 112 may be GaN, AlN, AlGaN, or InGaN. As necessary, the buffer layer 112 may be used by combining a plurality of layers, or by gradually changing a portion of a composition thereof.

The first conductivity-type semiconductor layer 114 may be a nitride semiconductor layer satisfying n-type $In_xAl_yGa_{1-x-y}N$ (where, $0 \le x \le 1$, and $0 \le y \le 1$), and the n-type impurity may be Si. For example, the first conductivity-type semiconductor layer 114 may include n-type GaN. The second conductivity-type semiconductor layer 116 may be a nitride semiconductor layer satisfying p-type $In_xAl_yGa_{1-x-y}N$ (where, $0 \le x \le 1$, $0 \le y \le 1$, $0 \le x+y<1$), and the p-type impurity may be Mg. For example, the second conductivity-type semiconductor layer 116 may be implemented as a single-layer structure, but example embodiments are not limited thereto, for example, the second conductivity-type semiconductor layer 116 may have a multilayer structure with different compositions.

The active layer 115 may have a multiple quantum well (MQW) structure in which a quantum well layer and a quantum barrier layer are alternately stacked with each other. For example, the quantum well layer and the quantum bather layer may be $In_xAl_yGa_{1-x-y}N$ (where, $0 \le x \le 1$, $0 \le x \le 1$, and $0 \le x+y \le 1$,) having different compositions. In a specific example, the quantum well layer may be $In_xGa_{1-x}N$ (where $0<x \le 1$), and the quantum barrier layer may be GaN or AlGaN. A thickness of the quantum well layer and a thickness of the quantum barrier layer may be within a range of 1 nm to 50 nm, respectively. The active layer 115 may have a multiple quantum well structure, but example embodiments are not limited thereto, and for example, the active layer 115 may have a single quantum well structure.

First and second electrode pads 119a and 119b may be arranged on a mesa-etched region of the first conductivity-type semiconductor layer 114 and the second conductivity-type semiconductor layer 116 in the same direction. The first electrode pad 119a is not limited thereto, but may include a material such as Ag, Ni, Al, Cr, Rh, Pd, Ir, Ru, Mg, Zn, Pt, Au, or the like, and may be adopted as a structure of a single layer or a structure of two or more layers. As necessary, the second electrode pad 119b may be a transparent electrode such as a transparent conductive oxide or a transparent conductive nitride, or may include graphene. The second electrode pad 119b may include at least one of Al, Au, Cr, Ni, Ti, or Sn.

FIG. 4B is a side cross-sectional view illustrating an example of another type of LED chip that may be employed in example embodiments.

Referring to FIG. 4B, an LED chip 110B may include a substrate 111 and a light emitting structure S disposed on the substrate 111, similarly to the structure described above. The light emitting structure S may include a buffer layer 112, a first conductivity-type semiconductor layer 114, an active layer 115, and a second conductivity-type semiconductor layer 116.

The LED chip 110B may include first and second electrode structures E1 and E2 respectively connected to the first and second conductivity-type semiconductor layers 114 and 116. The first electrode structure E1 has a connection electrode 118a such as a conductive via connected to the first conductivity-type semiconductor layer 114 through the second conductivity-type semiconductor layer 116 and the active layer 115, and a first electrode pad 119a connected to the connection electrode 118a. The connection electrode 118a may be surrounded by an insulating portion 117, and may be electrically separated from the active layer 115 and the second conductivity-type semiconductor layer 116. The connection electrode 118a may be disposed in a region from which the light emitting structure S is etched. The connection electrode 118a may appropriately design the number, a shape, or a pitch thereof, or a contact area thereof with the first conductivity-type semiconductor layer 114 to reduce contact resistance. In addition, the connection electrode 118a may be one from among a plurality of connection electrodes that are disposed to form rows and columns on the light emitting structure S, thereby improving current flow. The second electrode structure E2 may include an ohmic contact layer 118b and a second electrode pad 119b on the second conductivity-type semiconductor layer 116. The ohmic contact layer 118b may be one from among a plurality of ohmic contact layers disposed to form rows and columns on the light emitting structure S.

The connection electrode 118a and the ohmic contact layer 118b may include a conductive material having ohmic characteristics for the first and second conductivity-type semiconductor layers 114 and 116, respectively, to have a single layer or multilayer structure, and may include, for example, a material such as Ag, Al, Ni, Cr, a transparent conductive oxide (TCO), or the like.

The first electrode pad 119a and the second electrode pad 119b may be respectively connected to the connection electrode 118a and the ohmic contact layer 118b, to function as external terminals of the LED chip 110B. For example, the first electrode pad 119a and the second electrode pad 119b may be Au, Ag, Al, Ti, W, Cu, Sn, Ni, Pt, Cr, NiSn, TiW, AuSn, or eutectic metals thereof. The first and second electrode structures E1 and E2 may be arranged in the same direction.

As shown in FIG. 2, the reflective resin portion 150 may cover the lower surface S1 of the LED chip 110, and may extend to the side surfaces S3 of the LED chip 110. A side surface 152 of the reflective resin portion 150 may be coplanar with both the side surface 133 of the first wavelength conversion layer 130 and the second surface 142 of the second wavelength conversion layer 140. Opening may be provided in the reflective resin portion 150 that expose at least a portion of the conductive bumps 120. The reflective resin portion 150 may include a resin body containing reflective powder particles. For example, the resin body may include a silicone resin or an epoxy resin. A material constituting the resin body may have a refractive index that is lower than a refractive index of a light-transmitting material constituting the first wavelength conversion layer 130. Through this, total internal reflection of light emitted from the LED chip 110 may be minimized to improve light extraction efficiency of the semiconductor light emitting device 100. The reflective powder particles may be white ceramic powder particles or metal powder particles. For example, the ceramic powder particles may be at least one selected from the group consisting of $TiO_2$, $Al_2O_3$, $Nb_2O_5$, and ZnO. The metal powder particles may be a material such as Al or Ag.

Figure 5:
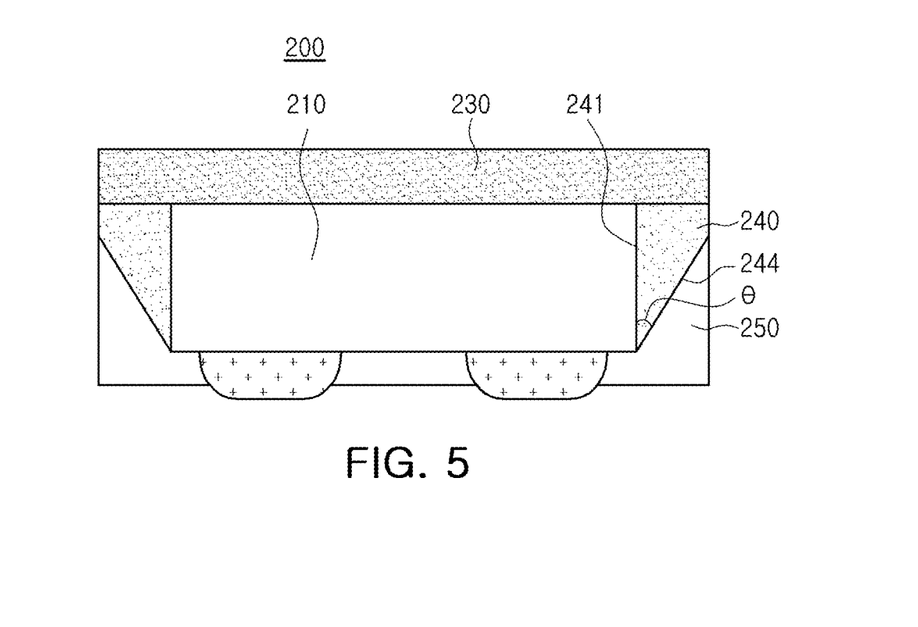
FIGS. 5 and 6 are side cross-sectional views illustrating semiconductor light emitting devices according to example embodiments.
Figure 6:
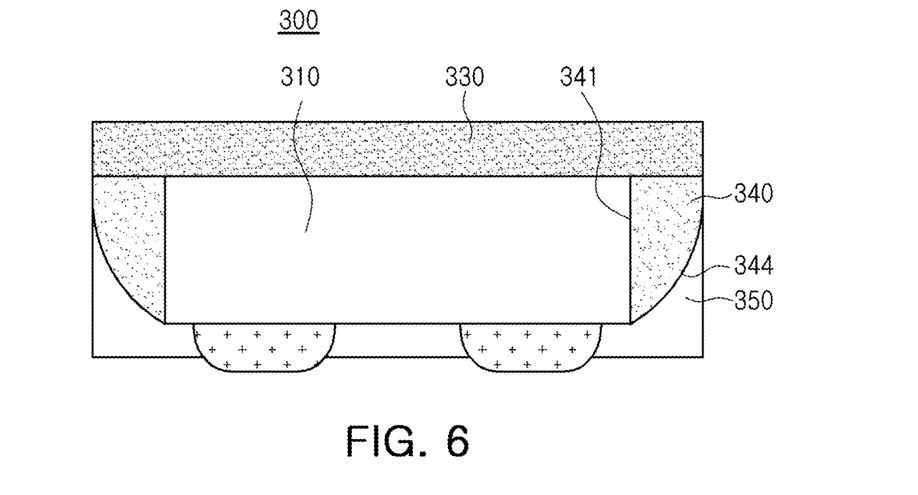

Semiconductor light emitting devices according to an example embodiments will be described with reference to FIGS. 5 and 6. FIGS. 5 and 6 are side cross-sectional views illustrating semiconductor light emitting devices according to example embodiments.

Referring to FIG. 5, a semiconductor light emitting device 200 according to an example embodiment may include an LED chip 210, a first wavelength conversion layer 230 disposed on the LED chip 210, a second wavelength conversion layer 240 covering a side surface 241 of the LED chip 210, and a reflective resin portion 250 covering the LED chip 210 and covering one surface of the second wavelength conversion layer 240. Configurations similar to those described above will be omitted, and differences therebetween will be mainly described.

In the second wavelength conversion layer 240 according to an example embodiment, a fourth surface 244 may be formed as a planar inclined surface having a predetermined angle of inclination θ with respect to the side surface 241 of the LED chip 210. The predetermined angle of inclination θ may be 10° to 70°.

Referring to FIG. 6, a semiconductor light emitting device 300 according to an example embodiment may include an LED chip 310, a first wavelength conversion layer 330 disposed on the LED chip 310, a second wavelength conversion layer 340 covering a side surface 341 of the LED chip 310, and a reflective resin portion 350 covering the LED chip 310 and covering one surface of the second wavelength conversion layer 340. Configurations similar to those described above will be omitted, and differences therebetween will be mainly described.

In the second wavelength conversion layer 340 according to an example embodiment, a fourth surface 344 may be formed in a concave curved surface. A radius of curvature of the curved surface may be 0.7 mm to 1.4 mm.

Next, a method of manufacturing a semiconductor light emitting device will be described with reference to FIGS. 8 to 12. FIGS. 8 to 12 are cross-sectional views for each main process illustrating a method of manufacturing the semiconductor light emitting device of FIG. 2.

Figure 8:
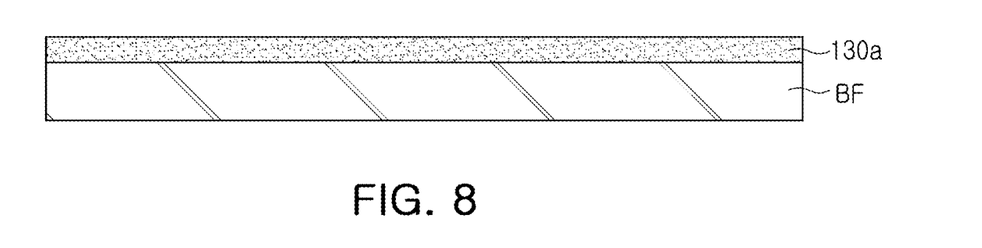
FIGS. 8 to 12 are cross-sectional views illustrating a method of manufacturing a semiconductor light emitting device according to an example embodiment.

Referring to FIG. 8, a wavelength conversion film 130a may be disposed on a base film BF. The wavelength conversion film 130a may be provided in an elastic semi-cured state by mixing a light-transmitting material with a wavelength conversion material such as a phosphor or a quantum dot. As the light-transmitting material, an epoxy resin or a silicone resin may be used. The wavelength conversion film 130a may be provided in a semi-cured state with adhesiveness by mixing light reflective particles with a light-transmitting material and heating the mixture to a temperature that is below a curing temperature. As the wavelength conversion film 130a is in the semi-cured state with adhesiveness, the wavelength conversion film 130a may be used to attach and align an LED chip 110 in a subsequent process. The wavelength conversion film 130a may include a first wavelength conversion material.

Figure 9:
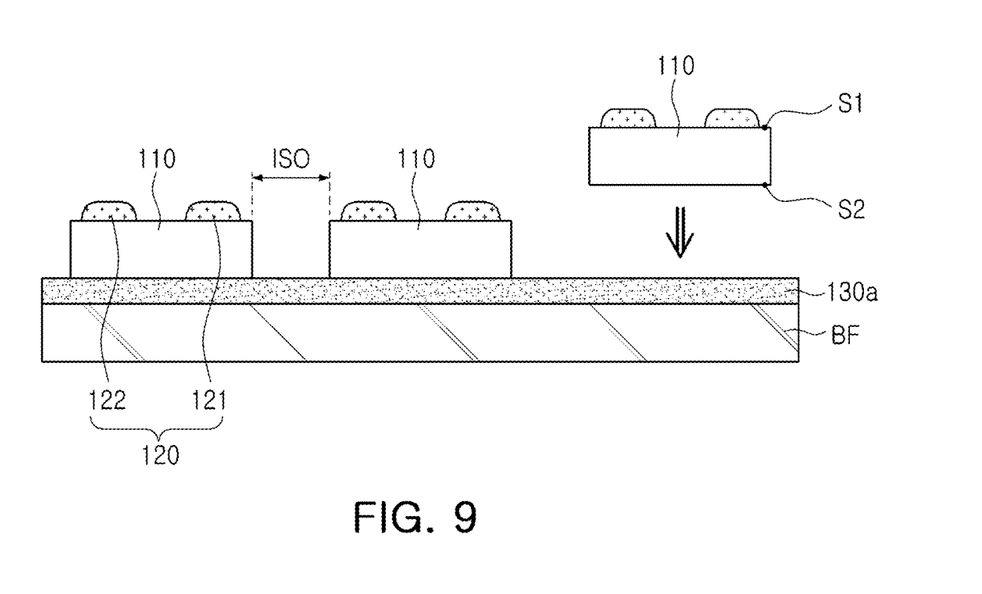

Next, referring to FIG. 9, a plurality of LED chips 110 may be arranged on the wavelength conversion film 130a. The LED chips 110 may have a first surface S1 on which conductive bumps 120 are disposed and a second surface S2. The LED chips 110 may be arranged such that the first surface S1 faces an upward direction, and the second surface S2 is attached to the wavelength conversion film 130a. A separation area ISO between the LED chips 110 may be determined in consideration of a space in which a second wavelength conversion layer is formed in a subsequent process and an area to be lost in a process of cutting into individual semiconductor light emitting devices.

After attaching the LED chip 110 to the wavelength conversion film 130a, the wavelength conversion film 130a may be cured by heating the same to a temperature above a curing temperature. In an example embodiment, the wavelength conversion film 130a may be cured by maintaining the temperature of the wavelength conversion film 130a at about 150° C. for about 30 minutes.

Figure 10:
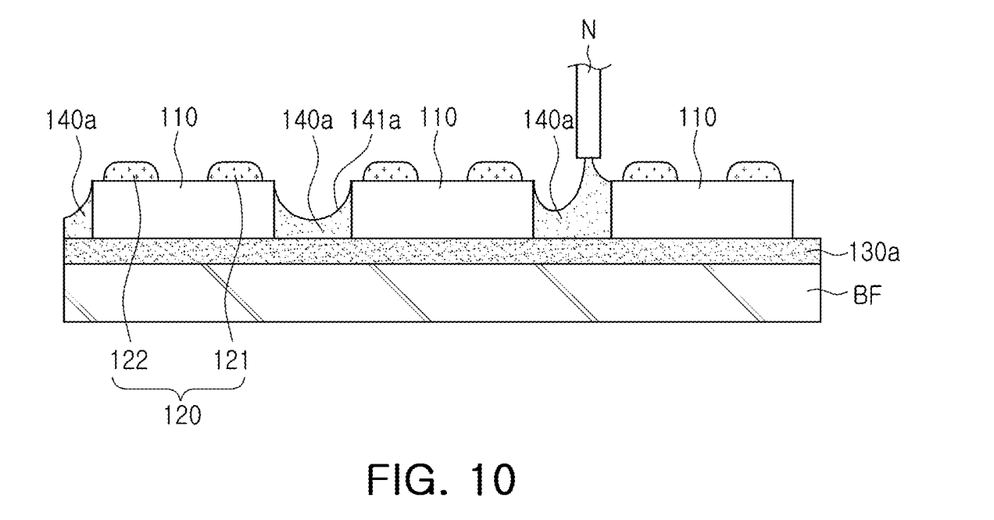

Next, as illustrated in FIG. 10, a wavelength conversion material may be applied between the LED chips 110 to form a wavelength conversion layer 140a. As described above, the wavelength conversion material may be dispersed in a light-transmitting material, which is liquid. Specifically, the light-transmitting material and the wavelength conversion material may be dispensed using a nozzle N. When the wavelength conversion material is dispersed in the light-transmitting material, which is liquid, and then dispensed to form the wavelength conversion layer 140a, a meniscus may be formed on a surface 141a of the wavelength conversion layer 140a due to surface tension. A shape of the surface 141a of the wavelength conversion layer 140a may be adjusted using viscosity and an amount of the light-transmitting material. The viscosity of the light-transmitting material may be controlled by adding a thixotropic agent, which includes powder particles.

The wavelength conversion layer 140a between the LED chips 110 may be cured by heating the wavelength conversion layer 140a to a temperature that is higher than the curing temperature of the light-transmitting material. In an example embodiment, the wavelength conversion layer 140a may be cured by maintaining the temperature of the wavelength conversion layer 140a at a temperature of about 150° C. for about 30 minutes.

Figure 11:
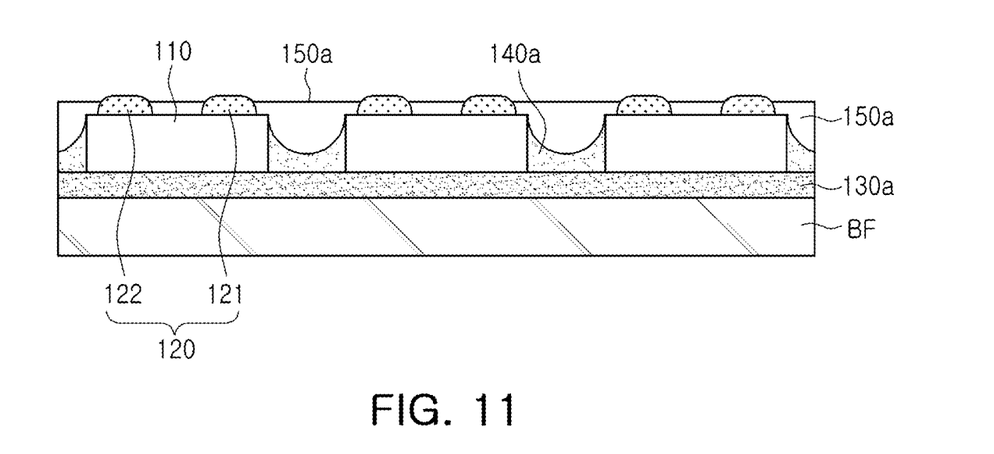

As illustrated in FIG. 11, a reflective resin portion 150a may be formed to cover the LED chip 110 and the wavelength conversion layer 140a.

Figure 12:
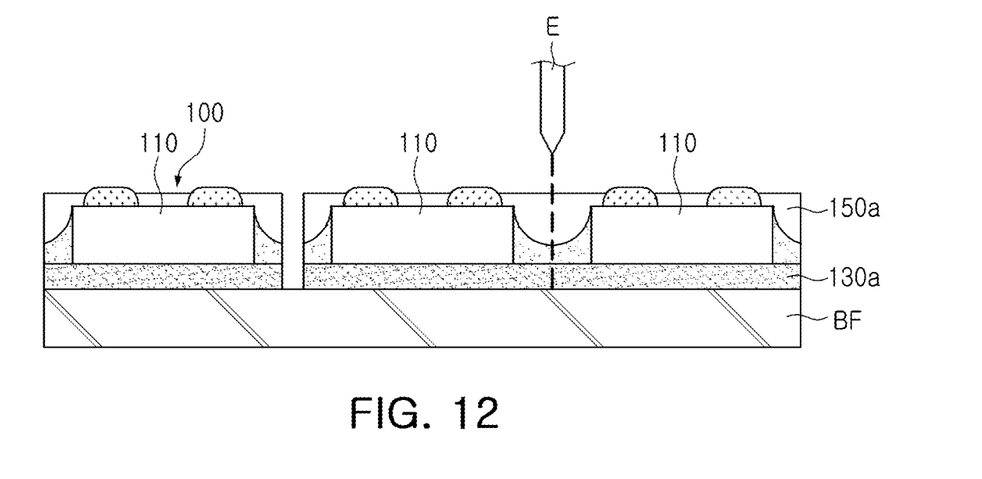

As illustrated in FIG. 12, the wavelength conversion film 130a, the wavelength conversion layer 140a, and the reflective resin portion 150a may be cut and separated into individual semiconductor light emitting devices 100 using a blade E. In this case, the wavelength conversion layer 140a may be cut in half, to form the cut second wavelength conversion layers 140a having the same thicknesses on a side surface of the semiconductor light emitting device 100. Example embodiments are not limited to cutting using a blade, and for example, the wavelength conversion film 130a, the wavelength conversion layer 140a, and the reflective resin portion 150a may be cut by using a laser beam or a water jet.

According to example embodiments, light loss in a wavelength conversion layer may be minimized by reducing a thickness of the wavelength conversion layer disposed on a side surface of an LED chip, and color uniformity of a light emitting surface may be improved by disposing different wavelength conversion layers on an upper surface and a side surface of the LED chip.

Example embodiments may provide additional advantages and effects that are not described above.

While example embodiments have been illustrated and described above, it will be apparent to those skilled in the art that modifications and variations could be made without departing from the scope of the present inventive concept as defined by the appended claims.

What is claimed is:

1. A semiconductor light emitting device comprising:
   a light-emitting diode (LED) chip having a lower surface on which a first electrode and a second electrode are arranged, an upper surface opposite to the lower surface, and a side surface between the upper surface and the lower surface;
   a first conductive bump disposed on the first electrode and a second conductive bump disposed on the second electrode;
   a first wavelength conversion layer having a first region provided on the upper surface of the LED chip and a second region which extends past the side surface of the LED chip;
   a second wavelength conversion layer having a first surface contacting the side surface of the LED chip, a second surface opposite to the first surface, a third surface connecting the first surface and the second surface, and contacting the second region, and a fourth surface located opposite to the third surface and inclined; and
   a reflective resin portion provided on the lower surface of the LED chip and the fourth surface, and defining openings that expose at least a portion of each of the first conductive bump and the second conductive bump,
   wherein a side surface of the first wavelength conversion layer, the second surface of the second wavelength conversion layer, and a side surface of the reflective resin portion are coplanar.

2. The semiconductor light emitting device of claim 1, wherein the fourth surface is a flat surface, with an angle of inclination of 10° to 70° with respect to the first surface.

3. The semiconductor light emitting device of claim 1, wherein the fourth surface is formed of a curved surface that is concave or convex toward the third surface, and has a radius of curvature of 0.7 mm to 1.4 mm.

4. The semiconductor light emitting device of claim 1, wherein a width of the second region is 5% to 37.5% of a width of the first region.

5. The semiconductor light emitting device of claim 1, wherein a width of the second surface is 5% to 80% of a width of the first surface.

6. The semiconductor light emitting device of claim 1, wherein the LED chip comprises:
   a substrate; and
   a light emitting structure disposed on the substrate and comprising a first conductivity-type semiconductor layer, an active layer, and a second conductivity-type semiconductor layer, and
   wherein the substrate is provided in the upper surface of the LED chip.

7. The semiconductor light emitting device of claim 1, wherein the LED chip further comprises an insulator provided on the lower surface of the LED chip, and
   wherein the first surface is in contact with the insulator.

8. The semiconductor light emitting device of claim 1, wherein the first wavelength conversion layer comprises a first wavelength conversion material,
   wherein the second wavelength conversion layer comprises a second wavelength conversion material, and
   wherein a concentration of the second wavelength conversion material is less than a concentration of the first wavelength conversion material.

9. The semiconductor light emitting device of claim 1, wherein a correlated color temperature value of light emitted through the first wavelength conversion layer is lower than a correlated color temperature value of light emitted through the second wavelength conversion layer.

10. The semiconductor light emitting device of claim 1, wherein the first wavelength conversion layer comprises a material having a first refractive index,
    wherein the second wavelength conversion layer comprises a material having a second refractive index, and
    wherein the first refractive index is lower than the second refractive index.

11. The semiconductor light emitting device of claim 10, wherein the reflective resin portion comprises a material having a third refractive index,
    wherein the first refractive index is greater than the third refractive index and lower than the second refractive index.

12. The semiconductor light emitting device of claim 1, wherein the reflective resin portion comprises light-dispersive powder particles.

13. A semiconductor light emitting device comprising:
    a light-emitting diode (LED) chip having a lower surface on which a first electrode and a second electrode are arranged, an upper surface opposite to the lower surface, and a side surface between the upper surface and the lower surface;
    a first wavelength conversion layer provided on the upper surface of the LED chip and comprising an extended region which extends past the side surface of the LED chip;
    a second wavelength conversion layer contacting the side surface of the LED chip and the extended region, wherein a cross-sectional area of the second wavelength conversion layer decreases as distance from the side surface of the LED chip increases; and a reflective resin portion provided on the lower surface of the LED chip, extending to the side surface of the LED chip, and having an interface contacting the second wavelength conversion layer, wherein the second wavelength conversion layer comprises a first surface contacting the side surface of the LED chip, a second surface opposite to the first surface, and wherein a side surface of the first wavelength conversion layer, the second surface of the second wavelength conversion layer, and a side surface of the reflective resin portion are coplanar.

14. The semiconductor light emitting device of claim 13, wherein the second wavelength conversion layer further comprises a third surface connecting the first surface and the second surface, and contacting the extended region, and a fourth surface located opposite to the third surface, contacting the reflective resin portion and inclined.

15. The semiconductor light emitting device of claim 13, further comprising a first conductive bump disposed on the first electrode and a second conductive bump disposed on the second electrode.

16. The semiconductor light emitting device of claim 13, wherein the interface has a flat surface, and
wherein the flat surface has an angle of inclination of 10° to 70° with respect to the side surface of the LED chip.

17. The semiconductor light emitting device of claim 13, wherein the interface has a curved surface, and
wherein the curved surface is concave or convex toward the first wavelength conversion layer, and has a radius of curvature of 0.7 mm to 1.4 mm.

18. The semiconductor light emitting device of claim 13, wherein the first wavelength conversion layer comprises a first wavelength conversion material,
wherein the second wavelength conversion layer comprises a second wavelength conversion material, and
wherein a concentration of the second wavelength conversion material is smaller than a concentration of the first wavelength conversion material.

19. A semiconductor light emitting device comprising:
a light-emitting diode (LED) chip having a lower surface on which a first electrode and a second electrode are arranged, an upper surface opposite to the lower surface, and a side surface between the upper surface and the lower surface;
a first conductive bump disposed on the first electrode and a second conductive bump disposed on the second electrode;
a first wavelength conversion layer provided on the upper surface of the LED chip and having an extended region which extends past the side surface of the LED chip;
a second wavelength conversion layer disposed to surround the side surface of the LED chip and contact the first wavelength conversion layer, wherein the second wavelength conversion layer has an upper surface, a side surface, and an inclined surface that is inclined with respect to the side surface of the second wavelength conversion layer and the side surface of the LED chip, and wherein the inclined surface faces an exterior of the LED chip; and
a reflective resin portion provided on the lower surface of the LED chip, the lower surface of the LED chip and the inclined surface of the second wavelength conversion layer, and defining openings that expose at least a portion of each of the first conductive bump and the second conductive bump,
wherein the side surface of the second wavelength conversion layer and a side surface of the reflective resin portion are coplanar.

20. The semiconductor light emitting device of claim 19, wherein the semiconductor light emitting device is configured to emit light through the side surface of the second wavelength conversion layer.

* * * * *